(12) United States Patent
Molina et al.

(10) Patent No.: US 12,206,426 B2
(45) Date of Patent: Jan. 21, 2025

(54) METHOD AND SYSTEM FOR DIGITAL EQUALIZATION OF A LINEAR OR NON-LINEAR SYSTEM

(71) Applicant: Intel Corporation, Santa Clara, CA (US)

(72) Inventors: Albert Molina, Novelda (ES); Martin Clara, Santa Clara, CA (US); Kameran Azadet, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 698 days.

(21) Appl. No.: 17/358,044

(22) Filed: Jun. 25, 2021

(65) Prior Publication Data
US 2023/0015514 A1 Jan. 19, 2023

(51) Int. Cl.
*H03M 1/00* (2006.01)
*H03M 1/06* (2006.01)
*H03M 1/10* (2006.01)

(52) U.S. Cl.
CPC ....... *H03M 1/1033* (2013.01); *H03M 1/0614* (2013.01); *H03M 1/002* (2013.01)

(58) Field of Classification Search
CPC .... H03M 1/0641; H03M 1/12; H03M 1/1215; H03M 1/164; H03M 1/0626;
(Continued)

(56) References Cited

U.S. PATENT DOCUMENTS 5,239,299 A * 8/1993 Apple ............... H03M 1/06
341/118
5,525,984 A * 6/1996 Bunker ............. H04N 5/21
341/131
(Continued)

OTHER PUBLICATIONS

Marttila, J. et al: "Reference Receiver Enhanced Digital Linearization of Wideband Direct-Conversion Receivers", IEEE Transactions on Microwave Theory and Techniques, IEEE, USA, vol. 65, No. 2, (Feb. 1, 2017), pp. 607-620, ISSN: 0018-9480, DOI: 10.1109/TMTT.2016.2638840, XP011640523 [retrieved on Feb. 8, 2017].
(Continued)

*Primary Examiner* — Linh V Nguyen
(74) *Attorney, Agent, or Firm* — SPL Patent Attorneys PartG mbB; Yong Beom Hwang

(57) ABSTRACT

A system and method for equalization of a linear or non-linear system. The system includes an adder configured to add an analog reference signal and an input signal, a processing system configured to process a sum of the analog reference signal and the input signal, a non-linear equalizer (NLEQ) configured to process an output of the processing system to remove a distortion incurred by the processing system, a calibration circuitry configured to generate a reconstructed reference signal in digital domain based on measurement of the analog reference signal, and generate coefficients for the NLEQ based on the reconstructed reference signal and the output of the processing system, and a subtractor configured to subtract the reconstructed reference signal from an output of the NLEQ. The analog reference signal may be a sinusoid including single or multiple tones of sinusoids. The non-linear system may be an analog-to-digital converter (ADC).

19 Claims, 8 Drawing Sheets

(58) Field of Classification Search
CPC .. H03M 1/0639; H03M 1/201; H03M 1/1042;
H03M 1/121; H03M 1/66; H03M 3/424;
H03M 1/1004; H03M 1/1033; H03M
1/1038; H03M 1/167; H03M 3/332;
H03M 1/0614; H03M 1/0617; H03M
1/069; H03M 1/0836; H03M 1/1028;
H03M 1/002; H03M 1/0624; H03M
1/0629; H03M 1/0646; H03M 1/066;
H03M 1/0673; H03M 1/0678; H03M
1/0687; H03M 1/0692; H03M 1/0695;
H03M 1/0854; H03M 1/1009; H03M
1/1023; H03M 1/1052; H03M 1/1057;
H03M 1/1061; H03M 1/1071; H03M
1/109; H03M 1/1205; H03M 1/1225;
H03M 1/129; H03M 1/181; H03M 1/186;
H03M 1/203; H03M 1/207; H03M 1/36;
H03M 1/361; H03M 1/42; H03M 1/44;
H03M 1/462; H03M 1/60; H03M 1/742;
H03M 13/6343; H03M 3/328; H03M
3/3287; H03M 3/33; H03M 3/348; H03M
3/358; H03M 3/386; H03M 3/458; H03M
3/46; H03M 3/464; H03M 7/165
USPC .................................. 341/118–121, 140, 155
See application file for complete search history.

(56) References Cited

U.S. PATENT DOCUMENTS

| | | | | |
|---|---|---|---|---|
| 6,016,113 A * | 1/2000 | Binder | .................. | H03M 1/207 |
| | | | | 341/131 |
| 6,653,959 B1 * | 11/2003 | Song | .................... | H03M 1/121 |
| | | | | 341/131 |
| 7,015,851 B1 * | 3/2006 | Bruhns | ............... | H03M 1/0646 |
| | | | | 341/131 |
| 7,075,466 B1 * | 7/2006 | Woodall | .............. | H03M 1/0629 |
| | | | | 341/131 |
| 7,199,736 B2 * | 4/2007 | Batruni | .............. | H03H 17/0273 |
| | | | | 330/136 |
| 7,688,235 B2 * | 3/2010 | Batruni | ............... | H03M 1/0626 |
| | | | | 341/118 |
| 7,782,235 B1 * | 8/2010 | Velazquez | ........... | H03M 1/1052 |
| | | | | 455/303 |
| 8,370,113 B2 * | 2/2013 | Batruni | ............... | H03M 1/1042 |
| | | | | 702/194 |
| 9,154,146 B1 * | 10/2015 | Chiu | .................... | H03M 1/1042 |
| 9,945,901 B1 * | 4/2018 | Otte | ..................... | H03M 1/1042 |
| 2012/0013494 A1 * | 1/2012 | Song | .................... | H03M 1/0641 |
| | | | | 341/122 |

OTHER PUBLICATIONS

Fu, D. et al: "A Digital Background Calibration Technique for Time-Interleaved Analog-to-Digital Converters", IEEE Journal of Solid-State Circuits, IEEE, USA, vol. 33, No. 12, (Dec. 1, 1998), pp. 1904-1911, ISSN: 0018-9200, DOI: 10.1109/4.735530, XP055412615.
Setterberg, B. et al: "A14b 2.5GS/s 8-Way-Interleaved Pipelined ADC with Background Calibration and Ditigal Dynamic Linearity Correction", Solid-State Circuits Conference Digest of Technical Papers (ISSCC), 2013 IEEE International, IEEE, (Feb. 17, 2013), pp. 466-467, ISBN: 978-1-4673-4515-6, DOI: 10.1109/ISSCC.2013.6487817, XP032350654.

* cited by examiner

METHOD AND SYSTEM FOR DIGITAL EQUALIZATION OF A LINEAR OR NON-LINEAR SYSTEM

FIELD

Examples relate to a method and system for digital equalization of a linear or non-linear system.

BACKGROUND

Digital equalization of a linear or nonlinear distortion of an analog-to-digital converter (ADC) (inclusive of the ADC input buffer) is an efficient technique to reduce power consumption for a given target performance. However, in order to adapt the equalizer, it is required to either use a purpose-generated training signal or the input signal itself. Another problem is that the equalizer needs to track changes in the analog impairments, and it is desirable to update the equalizer without interrupting the processing of the main ADC input signal.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e., only A, only B as well as A and B. An alternative wording for the same combinations is "at least one of A and B". The same applies for combinations of more than 2 elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

For the equalization of the linear and non-linear distortion of a non-linear system (such as an ADC), an analog-only design may be implemented to ensure that the performance is met by analog means only. However, the analog-only design is power-hungry for a given performance target.

Figure 1:
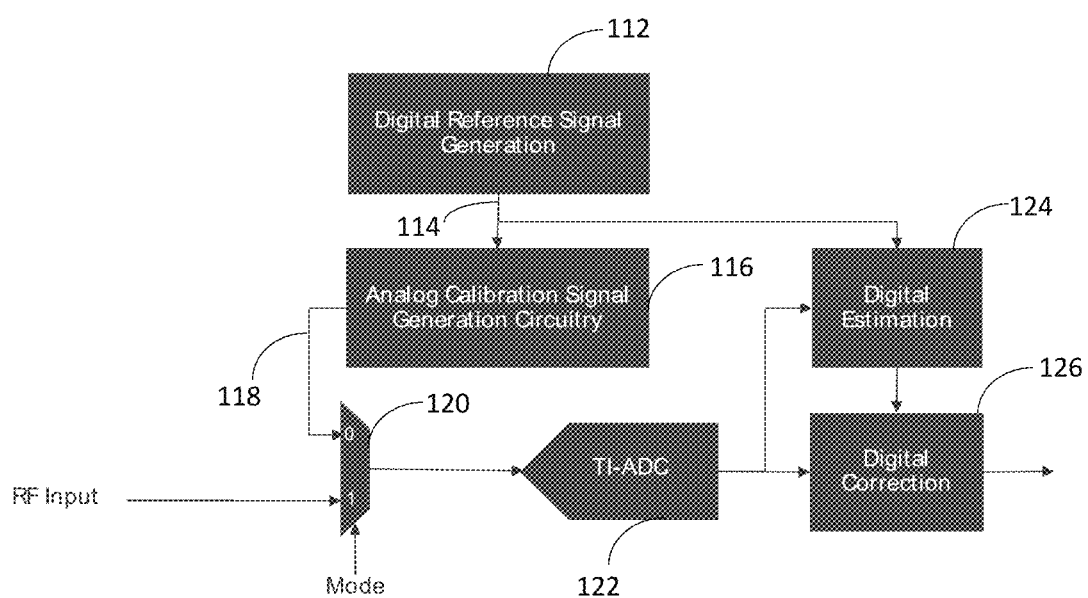
FIG. 1 shows an example for the off-line ADC calibration.

Alternatively, off-line calibration may be used. For the offline calibration, the ADC is taken offline, a calibration signal is injected into the ADC, and the equalizer is adapted based on the calibration signal. FIG. 1 shows an example for the off-line ADC calibration. A digital reference signal 114 is generated by a reference signal generation circuitry 112. The digital reference signal 114 is converted to an analog calibration signal 118 by an analog calibration signal generation circuitry 116. The analog calibration signal 118 is injected to the main ADC 122 (e.g., time interleaved ADC (TI-ADC)) via a multiplexer 120. The digital estimation circuitry 124 determines the coefficients for the digital correction circuitry 126 (e.g., a non-linear equalizer) based on the digital reference signal 114 and the output of the main ADC 122. The RF input signal is provided to the main ADC 122 via the multiplexer 120. The main ADC output is processed by the digital correction circuitry 126 to remove the distortion based the filter coefficients provided by the digital estimation circuitry 124.

However, for the off-line calibration, the ADC must be taken offline to track analog changes. The calibration circuitry must be very high precision and therefore, it is costly.

Figure 2:
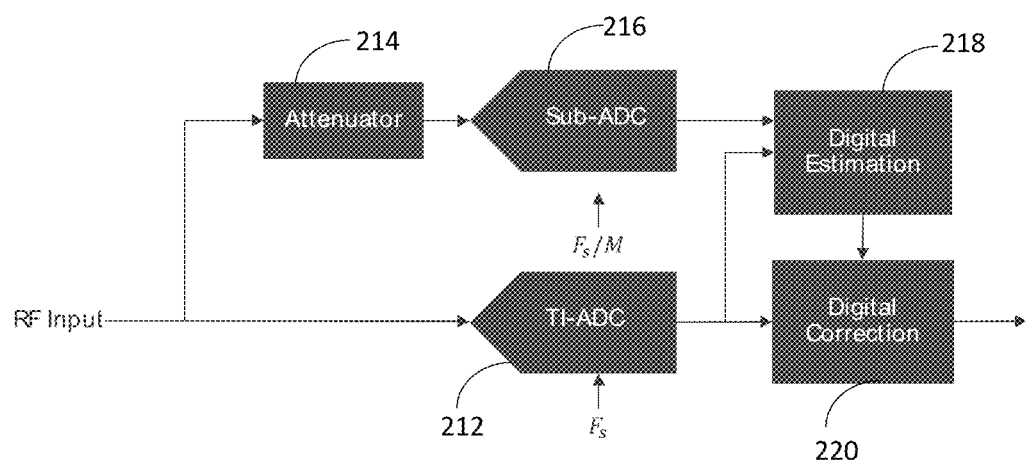
FIG. 2 shows another example for ADC calibration.

Alternatively, the calibration of the ADC may be performed using a reference ADC. FIG. 2 shows another example for ADC calibration. The input RF signal is provided to the main ADC 212 (e.g., TI-ADC) and a reference ADC 216 (e.g., a sub-ADC of the TI-ADC) via an attenuator 214. The reference ADC 216 is more linear than the main ADC 212 and the reference ADC 216 is used to adapt the equalizer (i.e., the digital correction circuitry 220). The digital estimation circuitry 218 determines the coefficients for the digital correction circuitry 220 based on the outputs of the main ADC 212 and the reference ADC 216.

Calibration using a reference ADC has some drawbacks. The reference ADC is noisier and slower than the main ADC. Therefore, the adaptation is slow and it is hard to track the changes in the input signal.

Examples for digital equalization of a linear or non-linear system (e.g., ADC) are disclosed hereafter. In examples, a reference signal is added to the input signal and this signal is used to adapt a non-linear equalizer (NLEQ).

The reference signal may comprise a sequence of one or more sinusoids, chirps, a noise-like signal(s), or the like. The sinusoids may not be spectrally pure. The sinusoids may have harmonics and a phase noise. The reference signal and its harmonics may be estimated using an observation ADC. By making the measurements sufficiently long, the effect of phase noise can be removed. A mechanism to differentiate between the harmonics introduced by the observation ADC and the harmonics of the reference signal is also disclosed. If the reference signal is periodic, the observation ADC may sub-sample it and hence operate at a low sampling rate. The reference signal added to the input signal is subtracted from the equalizer output.

The examples allow the ADC (more generally a non-linear system) to be equalized in the background without stopping the processing of the ADC (more generally the non-linear system). The reference signal may be generated using simple hardware. The observation ADC can be slow and relatively non-linear. The NLEQ adaptation is independent of the input signal. The calibration circuitry can be switched off for a long period of time, since it only needs to be enabled sufficiently often, e.g., to track temperature changes.

Figure 3:
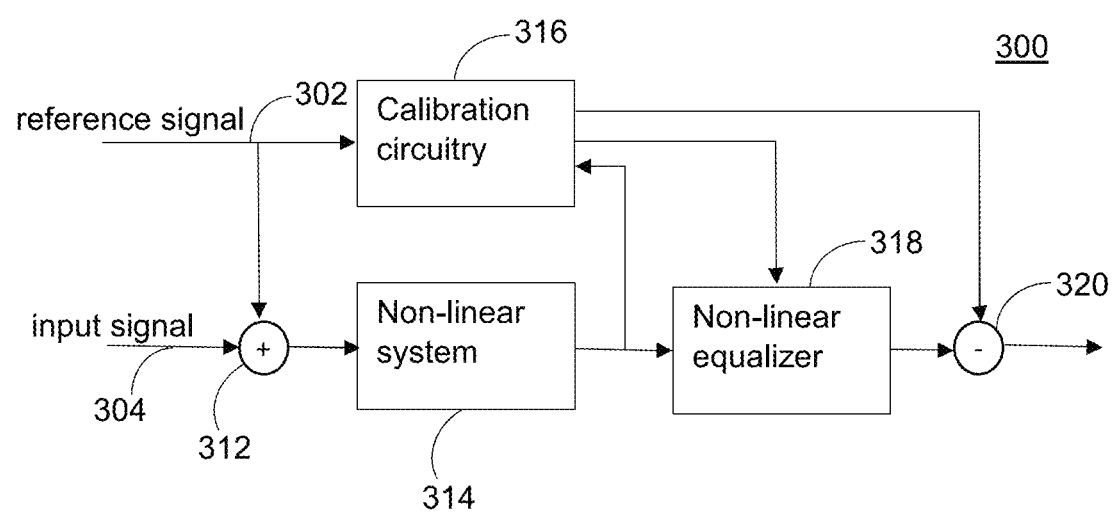
FIG. 3 is a block diagram of a system for equalization of a non-linear system.

FIG. 3 is a block diagram of a system 300 for equalization of a linear or non-linear system. The system 300 includes an adder 312, a non-linear system 314 (processing system), a calibration circuitry 316, an NLEQ 318, and a subtractor 320. The non-linear system 314 may be a linear system, and the examples disclosed herein are applicable to equalization of a linear system as well. A reference signal (analog signal) 302 is added by the adder 312 to the input signal 304 in analog domain. This reference signal 302 is used to adapt the NLEQ 318.

The sum of the reference signal 302 and the input signal 304 is sent to the non-linear system 314. The non-linear system 314 is configured to process the sum of the reference signal and the input signal. The non-linear system 314 may be an ADC in a receiver, or any other non-linear system. The non-linear system 314 incurs a non-linear distortion to the input, i.e., the sum of the reference signal and the input signal. The NLEQ 318 is configured to process an output of the non-linear system 314 to remove the linear and/or non-linear distortion incurred by the non-linear (or linear) system 314. The NLEQ 318 may be a digital non-linear filter, e.g., a polynomial or Volterra filter, or a linear filter, e.g., a finite impulse response (FIR) filter or an infinite impulse response (IIR) filter.

The calibration circuitry 316 is configured to generate a reconstructed reference signal in digital domain based on measurements of the analog reference signal 302 and generate coefficients for the NLEQ 318 based on the reconstructed reference signal and the output of the non-linear system 314. The subtractor 320 is configured to subtract the reconstructed reference signal from an output of the NLEQ 318. The reference signal 302 added to the input signal 304 in analog domain is subtracted from the output of the NLEQ 318 in digital domain.

The reference signal 302 may be a sinusoid(s). The reference signal 302 may be either a single tone signal or a multi-tone signal. Other signals other than a sinusoid may be used, e.g., a chirp, a noise-like signal, etc. The reference signal 302 may include harmonics of a fundamental frequency component of the sinusoid(s).

The calibration circuitry 316 may include an attenuator, an observation ADC, a reference reconstruction circuitry, an ADC model estimation circuitry, and an equalizer coefficient estimation circuitry. The attenuator may attenuate the analog reference signal 302. The observation ADC may be configured to convert the attenuated analog reference signal to digital domain. The reference reconstruction circuitry is configured to remove a distortion incurred by the observation ADC from an output of the observation ADC to generate the reconstructed reference signal in digital domain. The reconstructed reference signal is a digitized version of the reference signal after removing the distortion incurred by the observation ADC. The ADC model estimation circuitry is configured to estimate the ADC model parameters, i.e., the coefficients (a) for the main ADC based on the reconstructed reference signal. The equalizer coefficient estimation circuitry is configured to generate the coefficients for the NLEQ 318 based on the coefficients for the main ADC and the reconstructed reference signal.

Figure 4:
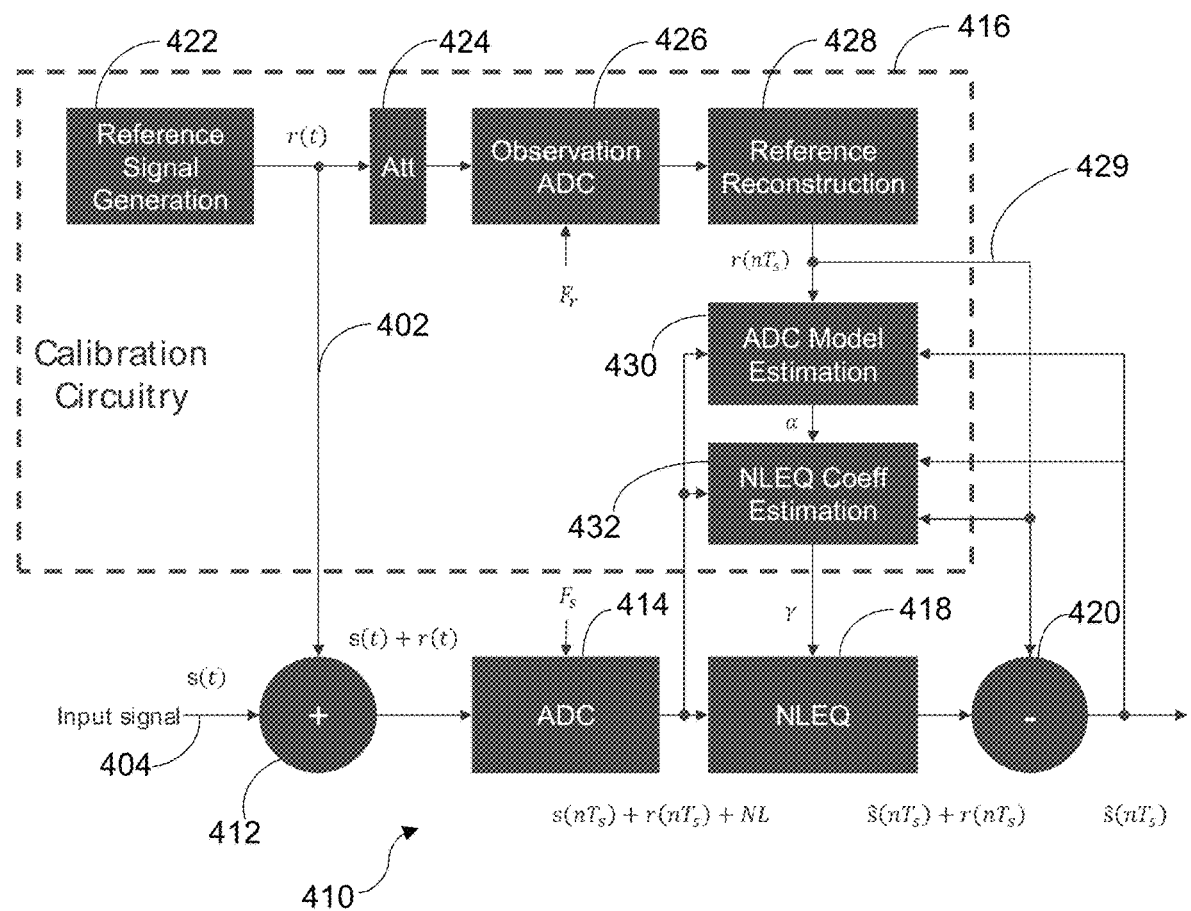
FIG. 4 is a block diagram of an example system for equalizing a non-linear system in accordance with one example.

FIG. 4 is a block diagram of an example system 400 for equalizing a non-linear system in accordance with one example. In this example, the non-linear system is an ADC (a main ADC in a receiver). However, the non-linear system may be any system having a non-linear characteristic response. The system 400 includes a calibration circuitry 416 and a data path 410 including a main ADC 414 and an NLEQ 418. A reference signal generation circuitry 422 generates a reference signal 402 (analog signal). The reference signal generation circuitry 422 may include a phase locked loop (PLL) or the like for generating an analog reference signal in a specific frequency or frequencies. The reference signal generation circuitry 422 may be a separate component from the calibration circuitry 416. In the main data path 410, the reference signal 402 is added to the input signal 404 by an adder 412 in analog domain. The sum of the input signal 404 and the reference signal 402 is fed to the main ADC 414 and converted to digital domain. The main ADC 414 may be a time interleaving ADC (TI-ADC) or any other type of ADC. The output of the main ADC 414 includes linear and/or non-linear distortion incurred by the main ADC 414. This distortion is removed by the NLEQ 418.

The calibration circuitry 416 may determine the coefficients for the NLEQ 418 by measuring the analog reference signal 402. For computing the coefficients, the analog reference signal 402 is attenuated by the attenuator 424 and converted to a digital signal by the observation ADC 426. The observation ADC 426 may be a sub-ADC of the main ADC 414 (e.g., a TI-ADC). Alternatively, the observation ADC 426 may be a separate, independent ADC. The reference reconstruction circuitry 428 reconstructs the reference signal in digital domain based on the output of the observation ADC 426. The reconstructed reference signal is a digitized version of the reference signal 402 after removing the distortion incurred by the observation ADC 426. The reconstructed reference signal 429 is used by the ADC model estimation circuitry 430 to estimate the ADC model parameters ($\alpha$ in Equations (26), (27), and (32)), and by the NLEQ coefficient estimation circuitry 432 to estimate the coefficients ($\gamma$ in Equations (24), (25), and (35)) for the NLEQ 418, which will be explained in detail below. The reconstructed reference signal 429 is subtracted by the subtractor 420 from the output of the NLEQ 418 in digital domain to recover the input signal 404. The calibration circuitry 416 may be switched off once the NLEQ coefficients have been learned.

In examples disclosed herein, the analog reference signal may comprise a sequence of sinusoids. The sinusoids do not have to be pure sinewaves and may contain harmonics of the fundamental frequency and a phase noise. The reference signal may be a single tone signal or a multi-tone signal. In examples, rather than demanding that these harmonics be below the target linearity specification of the ADC, the harmonics of the reference signal may be measured, so that effectively the reference signal may become a sinewave plus its harmonics. This measurement may be performed by capturing the reference signal 402 with an observation ADC 426. The observation ADC 426 itself has non-linearities so that there is a non-linear distortion in the output of the observation ADC 426.

In examples, the impact of the observation ADC non-linearity on the measurement of the reference signal 402 is removed or reduced. The reconstructed reference signal in digital domain may be used to estimate the non-linearity of the main ADC 414 and the coefficients for the NLEQ 418. If the reference signal 402 is periodic, the observation ADC 426 may sub-sample the reference signal 402 until all the samples of at least one such period is obtained. Once the NLEQ 418 has been adapted, the calibration circuitry 416 may be switched off to reduce power consumption.

The reference signal generation circuitry 422 generates a reference signal 402. The reference signal 402 may be generated by an imperfect phase locked loop (PLL) that has harmonics. The reference signal r for a given tone $\omega_c$ may be written as:

$$r = \Sigma_{j=1}{}'[A_{n(j)c} \cos(n(j)\omega_c t) + A_{n(j)s} \sin(n(j)\omega_c t)], \quad \text{Equation (1)}$$

where $n(1)=1$, $n(1) < \ldots n(J)$, and J is the highest harmonic.

Let the non-linear output of the observation ADC 426 include the sum of a linear term and I−1 non-linear terms as follows:

$$y_r(L) = \beta_1 Lr + \Sigma_{i=2}{}' \beta_i f_i(Lr), \quad \text{Equation (2)}$$

where $f_i(.)$ are non-linear functions of the input reference signal of order k(i), $\beta_i$ are real-valued coefficients, and L is an attenuation factor applied to the reference signal by the attenuator 424.

For the case of a memoryless non-linearity, $$f_i(Lr) = L^{k(i)} r^{k(i)}. \quad \text{Equation (3)}$$

For a non-linearity with memory, $$f_i(Lr) = L^{k(i)} \Pi_{j=1}{}^{k(i)} r(t - td_i(j)), \quad \text{Equation (4)}$$

where $td_i(j)$ for $j=1 \ldots k(i)$ are delays of r(t).

The output of the observation ADC 426 contains harmonics of the input reference signal 402. In general, it will have the following form:

$$y_r(L) = \Sigma_{j=1}{}'[R_{n(j)c} \cos(n(j)\omega_c nT_s) + R_{n(j)s} \sin(n(j)\omega_c nT_s)] + \Sigma_p[T_{m(p)c} \cos(m(p)\omega_c nT_s) + T_{m(p)s} \sin(m(p)\omega_c nT_s)], \quad \text{Equation (5)}$$

where $m(p) \neq n(j)$.

For instance, for $n(1:2) = [1,3]$ and $f_i(r) = r^{k(i)}$ with $k(1:4) = [1,2,3,5]$, $$r = A_{1c} \cos(\omega_c nT_s) + A_{1s} \sin(\omega_c nT_s) + A_{3c} \cos(3\omega_c nT_s) + A_{3s} \sin(3\omega_c nT_s), \quad \text{Equation (6)}$$

$$y_r(L) = R_{1c} \cos(\omega_c nT_s) + R_{1s} \sin(\omega_c nT_s) + R_{3c} \cos(3\omega_c nT_s) + R_{3s} \sin(3\omega_c nT_s) + \Sigma_{p=1}{}^{10}(T_{m(p)c} \cos(m(p)\omega_c nT_s) + T_{m(p)s} \sin(m(p)\omega_c nT_s)). \quad \text{Equation (7)}$$

$m(p) = [0,2,4,5,6,7,9,11,13,15]$.

Figure 5:
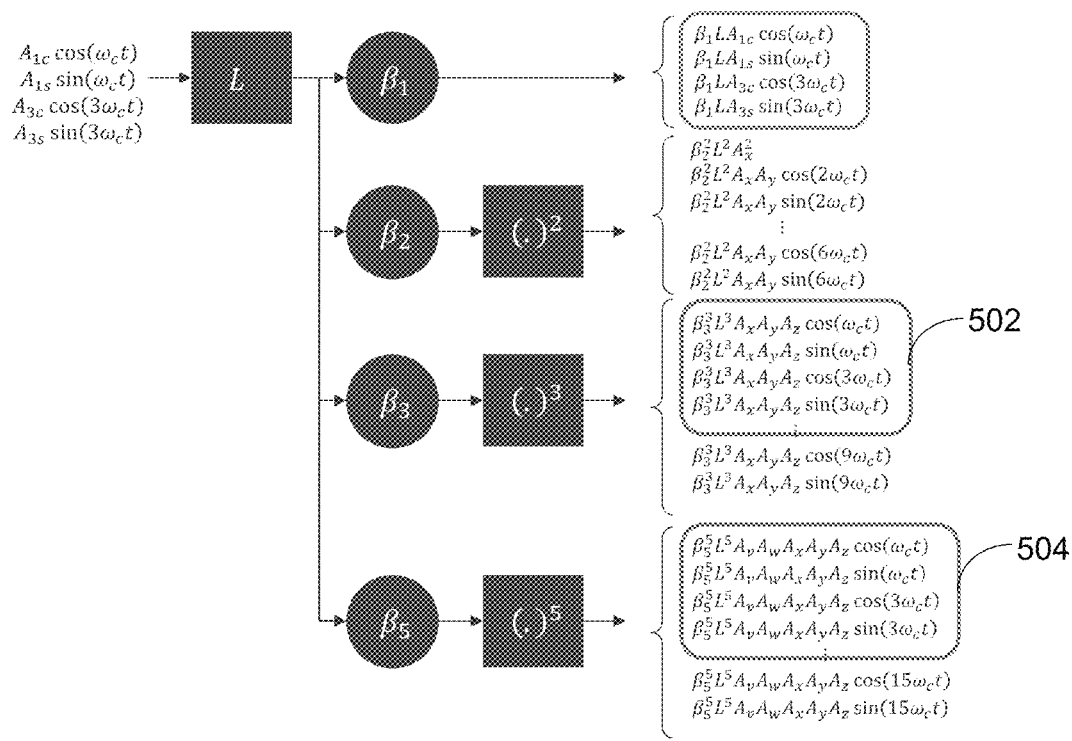
FIG. 5 shows an example of the harmonics at the output of a non-linear system excited with several input tones.

FIG. 5 shows an example of the harmonics at the output of a non-linear system (e.g., the ADCs 414, 426) excited with several input tones ($A_v$, $A_w$, $A_x$, $A_y$, $A_z$ represent combinations of $A_{1c}$, $A_{3c}$, $A_{1s}$, $A_{3s}$). FIG. 5 shows how the ADC buffer non-linear kernels add components to the tones of the input reference signal. Kernel 3 and kernel 5 add components to tones at $\omega_c$ and $3\omega_c$ as shown in 502 and 504. Even-order kernels do not add any components to the original signal since the original signal does not have any even-order harmonics. Therefore, to reconstruct the reference signal in digital domain, it is needed to either remove or minimize the non-linear components added by the observation ADC non-linearity at the reference signal tone positions. In this example, the $\beta_3{}^3 L^3$ and $\beta_5{}^5 L^5$ terms are removed from the continuous waves (e.g., a sinewave) of interest ($\omega_c$ and $3\omega_c$).

In order to reconstruct the reference signal (by the reference reconstruction circuitry 428), it is needed to remove the components added by the observation ADC non-linearity to the J components of the original reference signal 402. The output from the observation ADC 426 at $n(j)\omega_c$ is evaluated, where $j=1 \ldots J$ using $P_j$ values of the input attenuation (by the attenuator 424), at least one for each distinct kernel order k(i) of the observation ADC buffer that generates components at the reference signal tones locations.

For each reference signal attenuation by the attenuator 424, the coefficients $R_{n(j)c}$ and $R_{n(j)s}$, where $j=1 \ldots J$, are estimated for each tone of the reference signal. Each such term $(x=n(j))$ is of the form:

$$R_{xc}(L) = \beta_1 L A_{xc} + \Sigma_{i=1}{}^{P_j} L^{k(i)} B_{k(i)xc}, \quad \text{Equation (8)}$$

$$R_{xs}(L) = \beta_1 L A_{xs} + \Sigma_{i=1}{}^{P_j} L^{k(i)} B_{k(i)xs}, \quad \text{Equation (9)}$$

where $B_{k(i)xc}$ and $B_{k(i)xs}$ represent the interference components caused by the non-linearities of order k(i) on the cosine and since parts of the input tone x, respectively and $P_j$ represents the number of kernel orders that interfere with the tone at $n(j)\omega_c$.

In a matrix form, $$[R_{xc}(L) \ R_{xs}(L)] = [L \ L^{k(1)} \ \ldots \ L^{k(P_j)}] \begin{bmatrix} \beta_1 A_{xc} & \beta_1 A_{xs} \\ B_{k(1)xc} & B_{k(1)xs} \\ \vdots & \vdots \\ B_{k(P_j)xc} & B_{k(P_j)xs} \end{bmatrix}. \quad \text{Equation (10)}$$

The values of $R_{xc}(L)$ and $R_{xs}(L)$ can be estimated from a fast Fourier transform (FFT) of the input signal. Let the value at tone $x\omega_c$ be $F_x(L)$ (and at $\omega_s - x\omega_c$ be $F_x(L)^*$), then, it can be shown that:

$$R_{xc}(L) = \frac{2}{N} \text{Re}\{F_x(L)\}, \quad \text{Equation (11)}$$

$$R_{xs}(L) = -\frac{2}{N} \text{Im}\{F_x(L)\}. \quad \text{Equation (12)}$$

Alternatively, these values may be determined by correlation.

Such measurement may be performed for $P_j$ values of the input attenuation (one for each kernel of the non-linear buffer), $$\begin{bmatrix} \beta_1 A_{xc} & \beta_1 A_{sc} \\ B_{k(1)xc} & B_{k(1)sc} \\ \vdots & \vdots \\ B_{k(P_j)xc} & B_{k(P_j)sc} \end{bmatrix} = \quad \text{Equation (13)}$$

-continued $$\begin{bmatrix} L_1 & L_1^{k(1)} & \ldots & L_1^{k(P_j)} \\ L_2 & L_2^{k(1)} & \ldots & L_2^{k(P_j)} \\ \vdots & \vdots & \ddots & \vdots \\ L_{P_j} & L_{P_j}^{k(1)} & \ldots & L_{P_j}^{k(P_j)} \end{bmatrix}^{-1} \begin{bmatrix} R_{xc}(L_1) & R_{xs}(L_1) \\ R_{xc}(L_2) & R_{xs}(L_2) \\ \vdots & \vdots \\ R_{xc}(L_{P_j}) & R_{xs}(L_{P_j}) \end{bmatrix}.$$

The first row of the attenuation factor matrix inverse may be pre-computed and from this, $\beta_1 A_{xc}$ and $\beta_1 A_{sc}$ may be estimated, which allows to reconstruct the reference signal 402. This operation requires an inner product operation.

The non-linear output (y) of the main ADC 414 includes the sum of a linear term and Q–1 linear or non-linear terms as follows:

$$y = \alpha_1(r+s) + \Sigma_{q=2}^Q \alpha_q g_q(r+s), \qquad \text{Equation (14)}$$

where $g_q(.)$ are linear or non-linear functions of the input signal plus the reference signal of order $k(q)$ and $\alpha_q$ are real-valued coefficients.

It is assumed that the reference signal 402 is chosen so that it is uncorrelated with the input signal 403. Since the reference signal 402 may be a set of sinusoids, this can be achieved if the spectra of the reference signal 402 and the input signal 403 do not overlap. It is also assumed that the input signal 403 is zero-mean.

For the case of a memoryless non-linearity, $$g_q(r+s) = (r+s)^{k(q)}. \qquad \text{Equation (15)}$$

For a non-linearity with memory, $$g_q(r+s) = \Pi_{j=1}^{k(q)}(r(t-td_q(j)) + s(t-td_q(j))), \qquad \text{Equation (16)}$$

where $t\, d_q(j)$ for $j=1 \ldots k(q)$ are delays of $r(t)$ and $s(t)$.

For instance, for a memoryless non-linearity with $k=(1 \ldots 5)$, $$y = \alpha_1(r+s) + \alpha_2(r+s)^2 + \alpha_3(r+s)^3 + \alpha_4(r+s)^4 + \alpha_5(r+s)^5. \qquad \text{Equation (17)}$$

Equation (17) is expanded as:

$$y = (5\alpha_5 s^4 + 4\alpha_4 s^3 + 3\alpha_3 s^2 + 2\alpha_2 s + \alpha_1) r + (10\alpha_5 s^3 + 6\alpha_4 s^2 + 3\alpha_3 s + \alpha_2) r^2 + (10\alpha_5 s^2 + 4\alpha_4 s + \alpha_3) r^3 + (5\alpha_5 s + \alpha_4) r^4 + \alpha_5 r^5 + \alpha_5 s^5 + \alpha_4 s^4 + \alpha_3 s^3 + \alpha_2 s^2 + \alpha_1 s. \qquad \text{Equation (18)}$$

Since the input signal includes a sinusoid and its harmonics, when considering the equalizer, the content of the main ADC output at those specific frequencies and at the intermodulation distortion (IMD) products of the reference signal alone (i.e., excluding the input signal) generated by the main ADC are of interest. These can be determined via an FFT or via correlation. When the value of y at these specific frequencies $(y_F)$ is considered, the expected value is:

$$E\{y_F\} = (5\alpha_5 E\{s^4\} + 3\alpha_3 E\{s^2\} + \alpha_1) r + (6\alpha_4 E\{s^2\} + \alpha_2) r^2 + (10\alpha_5 E\{s^2\} + \alpha_3) r^3 + \alpha_4 r^4 + \alpha_5 r^5. \qquad \text{Equation (19)}$$

To accurately compute the equalizer coefficients, it is needed to eliminate or reduce the contributions of the input signal not removed by correlation that interfere with the reference signal kernels (e.g., the terms $5\alpha_e E\{s^4\} + 3\alpha_3 E\{s^2\}$ for the linear kernel). These terms are a function of even order statistics of the input signal and of the ADC nonlinear coefficients $\alpha_q$.

When the input signal has a low power, these terms could be disregarded. If not, then the signal even-order statistics and the non-linear coefficients can be estimated in an iterative fashion as part of the equalization scheme shown below. Higher-order interference terms like $10\alpha_5 E\{s^2\}r^3$ will generate tones that will interfere with the lower order tones of the reference signal r.

Consider a term of order K with memory, $$\alpha_K(r_{n-d_1} + s_{n-d_1}) \ldots (r_{n-d_K} + s_{n-d_K}). \qquad \text{Equation (20)}$$

Expanding this equation, $2^K$ terms are obtained. The interfering terms after correlation contain an even number $(k_e)$ terms of the form $s_{n-d_i}$, where $$k_e = 2\left(1 \ldots 2\left\lfloor \frac{K}{2} \right\rfloor\right).$$

The order of the ADC kernel that gets affected by this interference term is $k-k_e$.

For instance, for a third order kernel with memory, $$E\{\alpha(r_{n-d_1} + s_{n-d_1})(r_{n-d_2} + s_{n-d_2})(r_{n-d_3} + s_{n-d_3})\} = E\{\alpha(r_{n-d_1} r_{n-d_2} r_{n-d_3} + r_{n-d_1} r_{n-d_2} s_{n-d_3} + r_{n-d_1} s_{n-d_2} r_{n-d_3} + s_{n-d_1} r_{n-d_2} r_{n-d_3} + s_{n-d_1} r_{n-d_2} s_{n-d_3} + s_{n-d_1} s_{n-d_2} r_{n-d_3} + s_{n-d_1} s_{n-d_2} s_{n-d_3})\}. \qquad \text{Equation (21)}$$

The expected value of the signal at the $r_n$ and $r_n^3$ frequency locations is:

$$\alpha(r_{n-d_1} r_{n-d_2} r_{n-d_3} + E\{s_{n-d_2} s_{n-d_3}\} r_{n-d_1} + E\{s_{n-d_1} s_{n-d_3}\} r_{n-d_2} + E\{s_{n-d_1} s_{n-d_2}\} r_{n-d_3}). \qquad \text{Equation (22)}$$

The three terms $\alpha E\{s_{n-d_2} s_{n-d_3}\} r_{n-d_1}$, $\alpha E\{s_{n-d_1} s_{n-d_3}\} r_{n-d_2}$, and $\alpha E\{s_{n-d_1} s_{n-d_2}\} r_{n-d_3}$ need to be estimated and removed when estimating the equalizer coefficients.

Prior to defining the equalizer adaptation scheme, the following parameters are defined: FFT size (N), sampling frequency $(F_s)$, frequency bin $(\Delta = F_s/N)$, the number of input reference signals (T), and angular frequency of the input reference signal main tone $(\omega_{ci} = 2\pi k_{ci} \Delta f$, where $i = 1 \ldots T)$.

The reference signal (i) including harmonics is written as:

$$r_n^{(i)} = \sum_{j=1}^{J}\left[A_{n(j)c}\cos\left(\frac{2\pi}{N}n(j)k_{ci}n\right) + A_{n(j)s}\sin\left(\frac{2\pi}{N}n(j)k_{ci}n\right)\right]. \qquad \text{Equation (23)}$$

The equalizer model may be defined as:

$$z_n^{(i)} = \gamma_1 y_n^{(i)} + \Sigma_{j=2}^Q \gamma_j h_j(y_n^{(i)}), \qquad \text{Equation (24)}$$

where $h_j(.)$ are linear or non-linear basis functions, $y_n$ is an output from the main ADC 414, and $\gamma_j$ are real-valued coefficients. A vector of N samples of the equalizer output in a matrix form can be written as:

$$z^{(i)} = H^{(i)}\gamma. \qquad \text{Equation (25)}$$

where $z^{(i)} = [z_n^{(i)} \ldots z_{n+N}^{(i)}]^T$, $\gamma = [\gamma_1 \ldots \gamma_Q]^T$, $H^{(i)} = [h_1(y^{(i)}) \ldots h_Q(y^{(i)})]$, $h_j(y^{(i)}) = [h_j(y_n^{(i)}) \ldots h_j(y_{n+N}^{(i)})]^T$, and $h_1(y_n^{(i)}) = y_n^{(i)}$.

The ADC model may be defined as:

$$y_n^{(i)} = \alpha_1 x_n^{(i)} + \Sigma_{j=2}^P \alpha_j g_j(x_n^{(i)}), \qquad \text{Equation (26)}$$

where $g_j(.)$ are linear or non-linear basis functions and $\alpha_j$ are real-valued coefficients. A vector of N samples of the ADC output in a matrix form can be written as:

$$y^{(i)} = G^{(i)}\alpha, \qquad \text{Equation (27)}$$

where $y^{(i)} = [y_n^{(i)} \ldots y_{n+N}^{(i)}]^T$, $\alpha = [\alpha_1 \ldots \gamma_P]^T$, $G^{(i)} = [g_1(x^{(i)}) \ldots g_P(x^{(i)})]$, $g_j(x^{(i)}) = [g_j(x_n^{(i)}) \ldots g_j(x_{n+N}^{(i)})]^T$, and $g_1(x_n^{(i)}) = x_n^{(i)}$.

During the equalizer adaptation, the main ADC input signal is the sum of the normal ADC input and one of the reference signals as follows:

$$x_{n(i)} = r_n^{(i)} + s_n^{(i)}. \qquad \text{Equation (28)}$$

The basis functions in Equation (26) have the form:

$$g_j(r_n^{(i)} + s_n^{(i)}) = \Pi_{l=1}^{k(j)}(r_{n-d_{jl}}^{(i)} + s_{n-d_{jl}}^{(i)}), \qquad \text{Equation (29)}$$

where k(j) is the order of the basis function and $d_{jl}$ are the delays of the input signal for basis function j.

Expanding this basis function, $2^{k(j)}$ IMD products are obtained. Each of these IMD products consists of the product of k(j) signals. The first signal has a delay $d_{j1}$, the second signal has a delay $d_{j2}$, and so on, up to the last signal that has a delay $d_{jk(j)}$. Each of these signals are either $r_n^{(i)}$ or $s_n^{(i)}$.

Each IMD product can be divided into two sub-products: the r-sub-product (containing only the product of delayed versions of $r_n$ and the s-sub-product (containing only the product of delayed versions of $s_n^{(i)}$). Let the s-power be the number of instances of $s_n^{(i)}$ in the s-sub-product and the r-power be the number of instances of $r_n^{(i)}$ in the r-sub-product. There are $$\left\lfloor \frac{k(j)}{2} \right\rfloor$$

non-zero even s-powers. These are denoted as $$k_{ej} = 2\left(1 \ldots 2\left\lfloor \frac{k(j)}{2} \right\rfloor\right).$$

For each non-zero even s-power containing $k_{ej}$ instances of $s_n$, there are $$\binom{k(j)}{k_{ej}}$$

combinations of delays. In Matlab notation, these are the rows of n choosek($d_{ji}$: $d_{jk(j)}$, $k_{ej}$). Each IMD product with a non-zero even s-power is an interfering term of the form: E{even s-subproduct}·(r-subproduct). The r-sub-product is of order $k(j)-k_{ej}$. The IMD product will interfere with the reference signal terms (k(j)–$k_{ej}$): –2:1.

An equalizer adaptation scheme in accordance with one example is as follows.

1) For each input reference signal i = 1 ... T,
   a. Add the reference signal $r_n^{(i)}$ to the ADC input $s_n^{(i)}$ for n = 1..N,
   b. Capture the ADC output $y_n^{(i)}$ for n = 1.. N,
   c. Perform an N-point FFT of ADC output. Call this $Y_k^{(i)}$ for k = 1..N.
2) Initialize the ADC model coefficients: $\alpha_1 = 1$, $\alpha_i = 0$ for i = 2..P.
3) Initialize the equalizer model coefficients: $\gamma_1 = 1$, $\gamma_i = 0$ for i = 2..Q.
4) For I iterations,
   a. For each input reference signal i = 1 ... T,
      i. Compute equalizer output and subtract the previously estimated reference signal $r_n^{(i)}$. This is an estimate of the input signal $s_n^{(i)}$. Call this $\hat{s}_n^{(i)}$.
   b. Estimate the ADC model parameters.
      i. For reference signals i = 1... T, build the model matrix, $G^{(i)}$.
         1. Initialize the model basis matrix: $G^{(i)}$ = zeros(N, P).
         2. For j = 1 ... P (i.e., for each ADC basis functions),
            a. Accumulate zero s-power term, $$G^{(i)}(:,j) = g_j(r_n^{(i)}).$$

b. For $k_{ej} = 2\left(1 \ldots 2\left\lfloor \frac{k(j)}{2} \right\rfloor\right)$ (i.e., for each non-zero even s-power),
               i. Compute a matrix whose rows are the possible combinations of delays [$d_{j1}$ ... $d_{jk(j)}$] taking $k_{ej}$ delays at a time. Using Matlab notation this is
v = nchoosek($d_{j1}$:$d_{jk(j)}$, $k_{ej}$).

ii. For dcIdx = $1:\binom{k(j)}{k_{ej}}$ (i.e., for each $s_n$ delay combination),
                  1. Select a $s_n$ delay combination
[$v_1$ ... $v_{k_{ej}}$] = v(dcIdx,:)
                  2. Select the $r_n$ delay combination, i.e., the delays in $d_{ji}$:$d_{jk(j)}$ that are not in v(dcIdx,:). Using Matlab notation
[$u_1$ ... $u_{k(j)-k_{ej}}$] = setdiff($d_{j1}$:$d_{jk(j)}$, v(dcIdx,:)).
                  3. Add the interfering term, $$G^{(i)}(:,j) = G^{(i)}(:,j) + E\left\{\hat{s}_{n-v_1}^{(i)} \hat{s}_{n-v_2}^{(i)} \ldots \hat{s}_{n-v_{k_{ej}}}^{(i)}\right\} r_{n-u_1}^{(i)} r_{n-u_2}^{(i)} \ldots r_{n-u_{k(j)-k_{ej}}}^{(i)}.$$

ii. For reference signals i = 1 ... T, build the target vector, $t^{(i)}$:
         1. Identify the position of the harmonics and intermodulation products of the reference signal at the ADC model output. Let these frequency bins be n(j)$k_{ci}$, j = 1 ... S, where S is the number of such frequency bins.
         2. Generate an N-point mask which is one at n(j)$k_{ci}$ and zero elsewhere.
         3. Multiply $Y_k^{(i)}$ by this mask and perform the IFFT. Call this $\hat{y}^{(i)}$.
         4. $t^{(i)} = \hat{y}^{(i)}$.
      iii. Form the overall model matrix and target vector, $$G = \left[G^{(1)T} \ldots G^{(T)T}\right]^T, \quad \text{Equation (30)}$$

$$T = \left[t^{(1)T} \ldots t^{(T)T}\right]^T. \quad \text{Equation (31)}$$

iv. Estimate the model coefficients as follows:

$$\alpha = (G^T G)^{-1} G^T T. \quad \text{Equation (32)}$$

c. Estimate equalizer parameters.
      i. For reference signals i = 1 ... T, build the equalizer matrix, $H^{(i)}$.
         1. Select ADC output spectrum corresponding to the frequency tones occupied by the response of the ADC to the reference signal.
            a. Identify the position of the harmonics and intermodulation products of the reference signal at the ADC model output. Let these frequency bins be n(j)$k_{ci}$, j = 1 ... S, where S is the number of such frequency bins.
            b. Generate an N-point mask which is one at n(j)$k_{ci}$ and zero elsewhere.
            c. Multiply $Y_k^{(i)}$ by this mask and perform the IFFT. Call this $\hat{y}^{(i)}$.
         2. Cancel the interference terms generated by the intermodulation products between the input signal $s_n^{(i)}$ and the reference signal at the ADC output.
            a. Initialize the cancellation vector: c = zeros(N, 1).
            b. For j = 1 ... Q (i.e., for each ADC basis functions), a. For $k_{ej} = 2\left(1 \ldots 2\left\lfloor \frac{k(j)}{2} \right\rfloor\right)$ (i.e., for each non-zero even s-power),
                  i. Compute a matrix whose rows are the possible combinations of delays [$d_{j1}$ ... $d_{jk(j)}$] taking $k_{ej}$ delays at a time. Using Matlab notation this is
v = nchoosek($d_{j1}$:$d_{jk(j)}$, $k_{ej}$).

ii. For dcIdx = $1:\binom{k(j)}{k_{ej}}$ (i.e., for each $s_n$ delay combination),
                    1. Select a $s_n$ delay combination
[$v_1$ ... $v_{k_{ej}}$] = v(dcIdx,:).
                    2. Select the $r_n$ delay combination, i.e., the delays in $d_{j1}$:$d_{jk(j)}$ that are not in v(dcIdx,:). Using Matlab notation
[$u_1$ ... $u_{k(j)-k_{ej}}$] = setdiff($d_{j1}$:$d_{jk(j)}$, v(dcIdx,:)).
                    3. Add the interfering term to the cancellation vector as follows:

$$c = c + \alpha_j E\left\{\hat{s}_{n-v_1}^{(i)} \hat{s}_{n-v_2}^{(i)} \ldots \hat{s}_{n-v_{k_{ej}}}^{(i)}\right\} r_{n-u_1}^{(i)} r_{n-u_2}^{(i)} \ldots r_{n-u_{k(j)-k_{ej}}}^{(i)}.$$

-continued c. Subtract the cancellation vector from the ADC output
$\hat{y}_c^{(i)} = y^{(i)} - c$.
3. Compute the equalizer basis matrix and the target vector $$H^{(i)} = [h_1(\hat{y}_c^{(i)}) \ldots h_Q(\hat{y}_c^{(i)})],$$
$$t^{(i)} = r^{(i)}.$$

ii. Form the overall model matrix and target vector $$H = [H^{(1)^T} \ldots H^{(T)^T}]^T,$$ Equation (33)

$$T = [t^{(1)^T} \ldots t^{(T)^T}]^T.$$ Equation (34)

iii. Estimate the model coefficients as follows;
$$\gamma = (H_c^T H_c)^{-1} H_c^T T.$$ Equation (35)

The main ADC 414 in FIG. 4 may be a time-interleaved ADC and examples disclosed above may be applied to the system including a time-interleaved ADC. A time-interleaved ADC includes a plurality of sub-ADCs coupled in parallel. Time-interleaving of the sub-ADCs is a way to increase the overall system sampling rate by using several ADCs in parallel. An M-channel time-interleaved ADC that includes M sub-ADCs coupled in parallel increases the sampling rate by a factor of M.

In a time-interleaved ADC each sample is taken by a different sub-ADC. Each sub-ADC is characterized by its own set of parameters ($\alpha$ in the equation below). For instance, with M sub-ADCs, the time-interleaved ADC output may be written as follows:

$$y_{Mn+m}^{(i)} = \alpha_1^{(m)} x_{mn+m}^{(i)} + \Sigma_{j=2}^P \alpha_j^{(m)} g_j(x_{Mn+m}^{(i)}),$$ Equation (36)

where m=0 . . . M−1.

Examples disclosed above may be applied to the time division multiplex (TDD) system. In a TDD system, either the transmitter or the receiver is connected to the transmission channel. In a TDD system, a base station or a user equipment either transmits or receives over the air. The ADC in the main receive chain is required when the system receives. Hence, while transmission, the reference signal only can be injected to the main ADC 414 (without the "interference" of the input signal 404). This leads to some simplifications in the example schemes. In this case, the signal interference does not have to be removed and the ADC model does not need to be estimated, but just needs the equalizer model.

In some examples, different basis functions may be used. In the examples disclosed above, monomial basis functions for ADC model and equalizer are assumed as follows:

$$g_j(x_n^{(i)}) = \Pi_{l=1}^{k(j)}(x_{n-d_{jl}}^{(i)}).$$ Equation (37)

Alternatively, it is possible to use different basis functions as well. For instance, $g_j(.)$ could be implemented using a look-up table.

Figure 6:
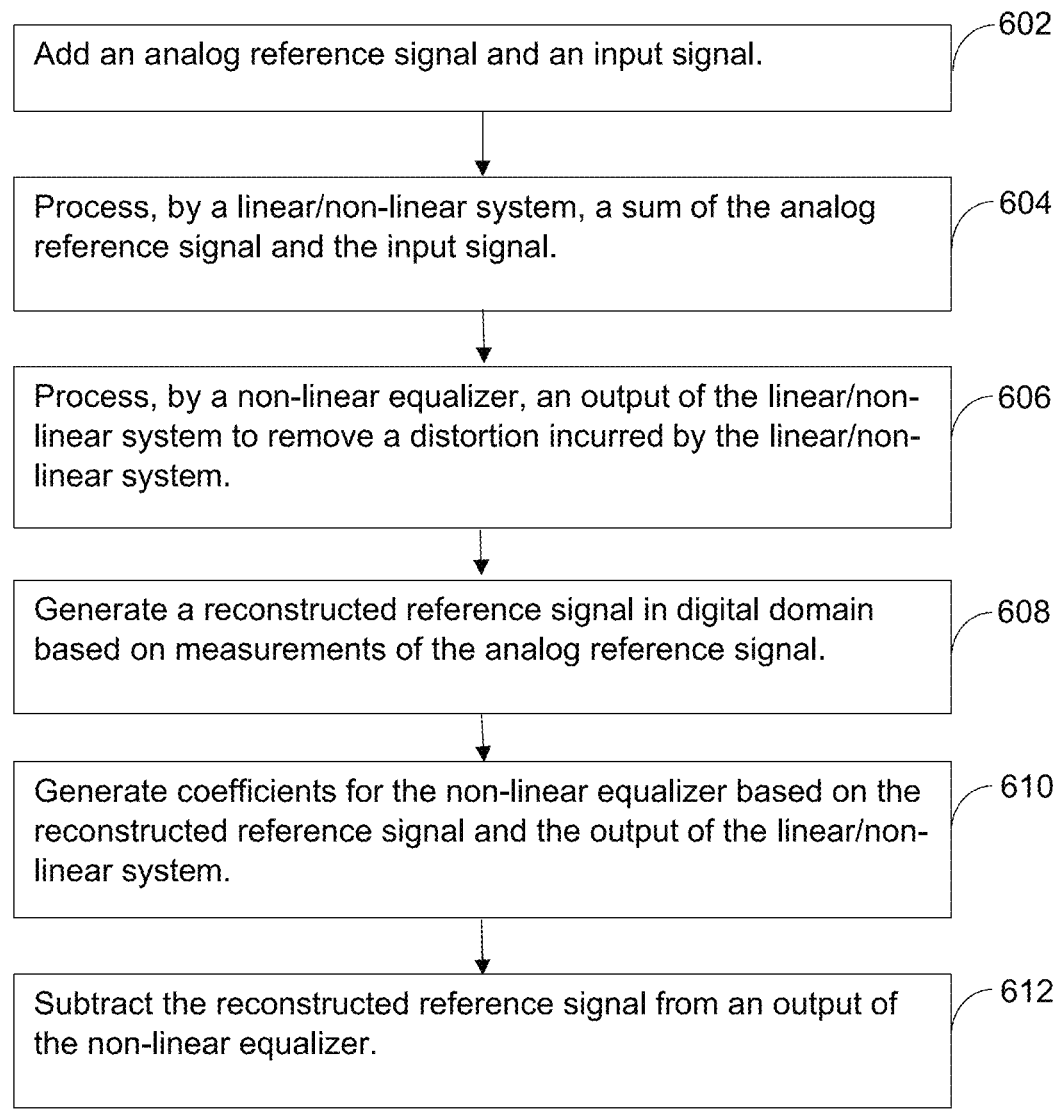
FIG. 6 is a flow diagram of an example process for equalization of a non-linear system.

FIG. 6 is a flow diagram of an example process for equalization of a linear or non-linear system. The method includes adding an analog reference signal and an input signal (602). The method further includes processing, by a linear or non-linear system, a sum of the analog reference signal and the input signal (604). The method includes processing, by a non-linear equalizer, an output of the linear/non-linear system to remove a distortion incurred by the linear/non-linear system (606). The method includes generating a reconstructed reference signal in digital domain based on measurements of the analog reference signal (608). The method includes generating coefficients for the non-linear equalizer based on the reconstructed reference signal and the output of the linear/non-linear system (610). The method includes subtracting the reconstructed reference signal from an output of the non-linear equalizer (612).

The analog reference signal may be a sinusoid. The analog reference signal may include harmonics of a fundamental frequency component. The analog reference signal may include multiple tones of sinusoids. The non-linear system may be an ADC.

The reconstructed reference signal and the coefficients for the non-linear equalizer may be generated by attenuating the analog reference signal, converting, by an observation ADC, the attenuated analog reference signal to digital domain, generating the reconstructed reference signal by removing a distortion incurred by the observation ADC from an output of the observation ADC, and generating the coefficients for the non-linear equalizer based on the reconstructed reference signal. The analog reference signal may be chosen to be uncorrelated with the input signal. The spectra of the analog reference signal and the input signal may not overlap.

Figure 7:
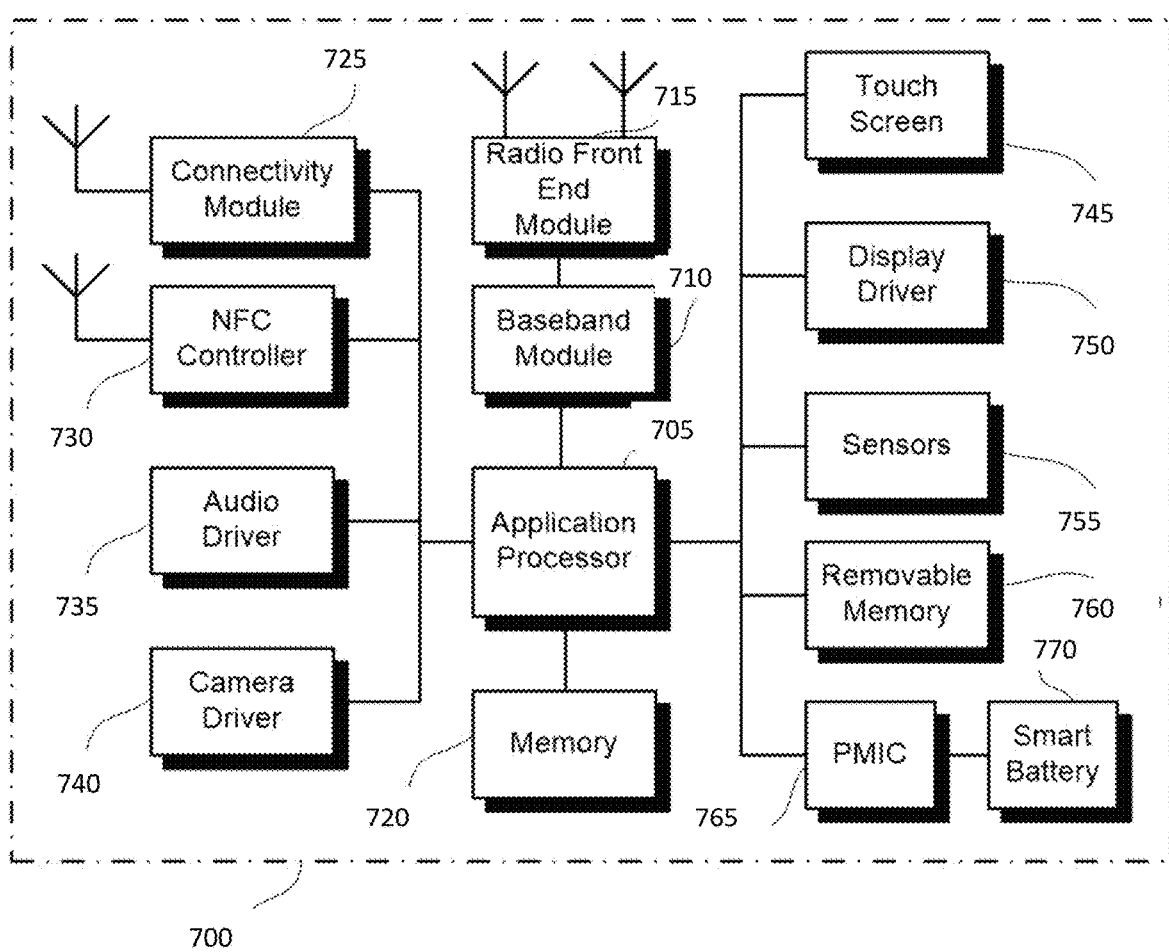
FIG. 7 illustrates a user device in which the examples disclosed herein may be implemented.

FIG. 7 illustrates a user device 700 in which the examples disclosed herein may be implemented. For example, the examples disclosed herein may be implemented in the radio front-end module 715, in the baseband module 710, etc. The user device 700 may be a mobile device in some aspects and includes an application processor 705, baseband processor 710 (also referred to as a baseband module), radio front end module (RFEM) 715, memory 720, connectivity module 725, near field communication (NFC) controller 730, audio driver 735, camera driver 740, touch screen 745, display driver 750, sensors 755, removable memory 760, power management integrated circuit (PMIC) 765 and smart battery 770.

In some aspects, application processor 705 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 710 may be implemented, for example, as a solder-down substrate including one or more integrated circuits, a single packaged integrated circuit soldered to a main circuit board, and/or a multi-chip module containing two or more integrated circuits.

Figure 8:
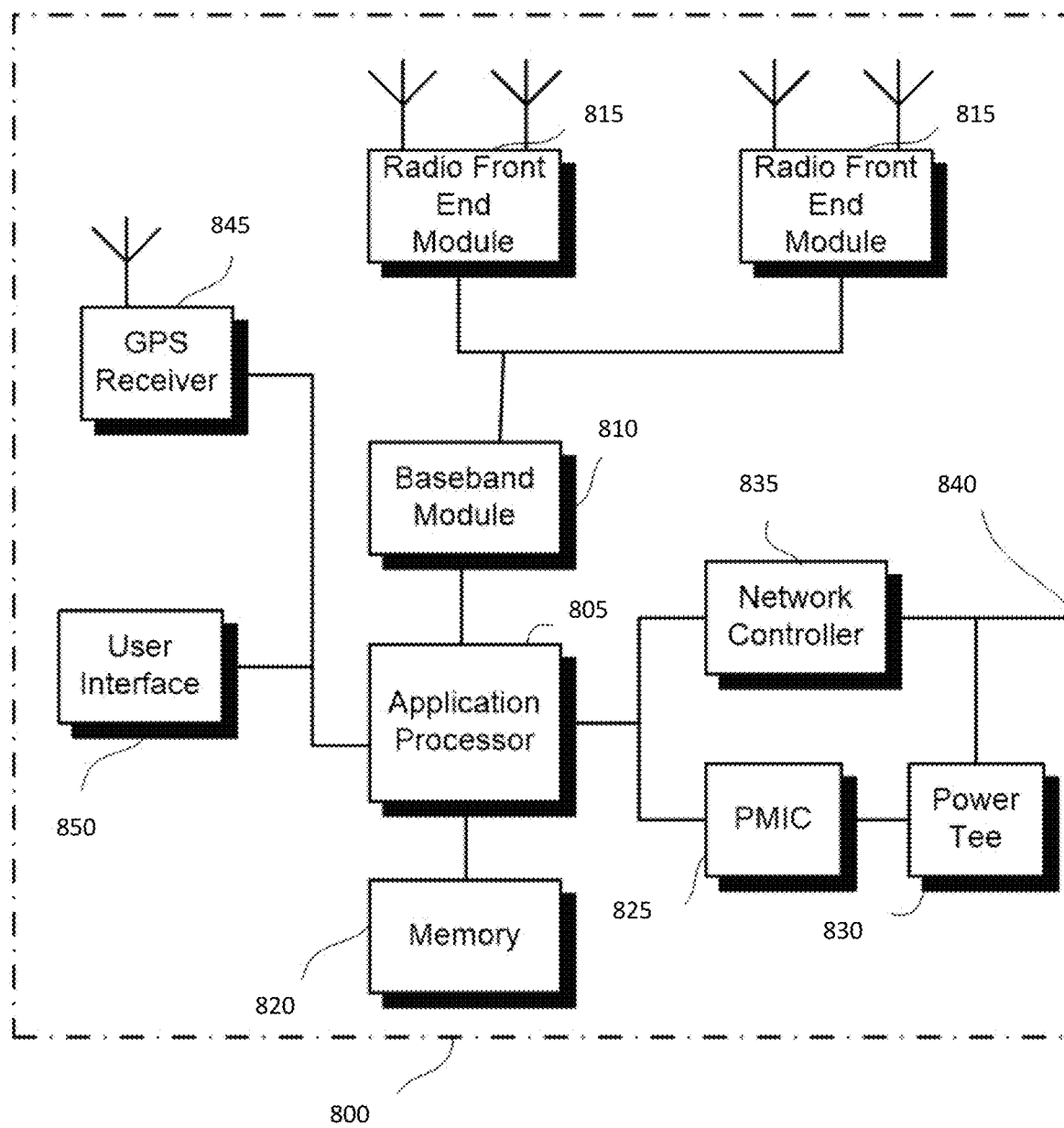
FIG. 8 illustrates a base station or infrastructure equipment radio head in which the examples disclosed herein may be implemented.

FIG. 8 illustrates a base station or infrastructure equipment radio head 800 in which the examples disclosed herein may be implemented. For example, the examples disclosed herein may be implemented in the radio front-end module 815, in the baseband module 810, etc. The base station radio head 800 may include one or more of application processor 805, baseband modules 810, one or more radio front end modules 815, memory 820, power management circuitry 825, power tee circuitry 830, network controller 835, network interface connector 840, satellite navigation receiver module 845, and user interface 850.

In some aspects, application processor 805 may include one or more CPU cores and one or more of cache memory, low drop-out voltage regulators (LDOs), interrupt controllers, serial interfaces such as SPI, I2C or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 810 may be implemented, for example, as a solder-down substrate including one or more integrated circuits, a single packaged integrated circuit soldered to a main circuit board or a multi-chip module containing two or more integrated circuits.

In some aspects, memory 820 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magneto resistive random access memory (MRAM) and/or a three-dimensional crosspoint memory. Memory 820 may be implemented as one or more of solder down packaged integrated circuits, socketed memory modules and plug-in memory cards.

In some aspects, power management integrated circuitry 825 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 830 may provide for electrical power drawn from a network cable to provide both power supply and data connectivity to the base station radio head 800 using a single cable.

In some aspects, network controller 835 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 845 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 845 may provide data to application processor 805 which may include one or more of position data or time data. Application processor 805 may use time data to synchronize operations with other radio base stations.

In some aspects, user interface 850 may include one or more of physical or virtual buttons, such as a reset button, one or more indicators such as light emitting diodes (LEDs) and a display screen.

Another example is a computer program having a program code for performing at least one of the methods described herein, when the computer program is executed on a computer, a processor, or a programmable hardware component. Another example is a machine-readable storage including machine readable instructions, when executed, to implement a method or realize an apparatus as described herein. A further example is a machine-readable medium including code, when executed, to cause a machine to perform any of the methods described herein.

The examples as described herein may be summarized as follows.

An example (e.g., example 1) relates to a system for equalization of a linear or non-linear system. The system includes an adder configured to add an analog reference signal and an input signal, a processing system configured to process a sum of the analog reference signal and the input signal, a non-linear equalizer (NLEQ) configured to process an output of the processing system to remove a distortion incurred by the processing system, a calibration circuitry configured to generate a reconstructed reference signal in digital domain based on measurement of the analog reference signal, and generate coefficients for the NLEQ based on the reconstructed reference signal and the output of the processing system, and a subtractor configured to subtract the reconstructed reference signal from an output of the NLEQ.

Another example (e.g., example 2) relates to a previously described example (e.g., example 1), wherein the analog reference signal is a sinusoid.

Another example (e.g., example 3) relates to a previously described example (e.g., example 2), wherein the analog reference signal includes harmonics of a fundamental frequency component.

Another example (e.g., example 4) relates to a previously described example (e.g., example 2), wherein the analog reference signal includes multiple tones of sinusoids.

Another example (e.g., example 5) relates to a previously described example (e.g., any one of examples 1-4), wherein the processing system includes a main ADC in a receiver.

Another example (e.g., example 6) relates to a previously described example (e.g., example 5), wherein the main ADC is a time-interleaved ADC.

Another example (e.g., example 7) relates to a previously described example (e.g., any one of examples 5-6), wherein the calibration circuitry includes an attenuator configured to attenuate the analog reference signal, an observation ADC configured to convert the attenuated analog reference signal to digital domain, a reference reconstruction circuitry configured to remove a distortion incurred by the observation ADC from an output of the observation ADC to generate the reconstructed reference signal, an ADC model estimation circuitry configured to generate coefficients for the main ADC based on the reconstructed reference signal, and an NLEQ coefficient estimation circuitry configured to generate the coefficients for the NLEQ based on the coefficients for the main ADC and the reconstructed reference signal.

Another example (e.g., example 8) relates to a previously described example (e.g., example 7), wherein the observation ADC is running at a lower sampling rate than the main ADC.

Another example (e.g., example 9) relates to a previously described example (e.g., any one of examples 1-8), wherein the analog reference signal is chosen to be uncorrelated with the input signal.

Another example (e.g., example 10) relates to a previously described example (e.g., example 9), wherein spectra of the analog reference signal and the input signal do not overlap.

Another example (e.g., example 11) relates to a previously described example (e.g., any one of examples 1-10), wherein the calibration circuitry is turned off once the NLEQ is adapted.

Another example (e.g., example 12) relates to a method for equalization of a linear or non-linear system. The method includes adding an analog reference signal and an input signal, processing, by a processing system, a sum of the analog reference signal and the input signal, processing, by a non-linear equalizer, an output of the processing system to remove a distortion incurred by the processing system, generating a reconstructed reference signal in digital domain based on measurements of the analog reference signal, generating coefficients for the non-linear equalizer based on the reconstructed reference signal and the output of the processing system, and subtracting the reconstructed reference signal from an output of the non-linear equalizer.

Another example (e.g., example 13) relates to a previously described example (e.g., example 12), wherein the analog reference signal is a sinusoid.

Another example (e.g., example 14) relates to a previously described example (e.g., example 13), wherein the analog reference signal includes harmonics of a fundamental frequency component.

Another example (e.g., example 15) relates to a previously described example (e.g., any one of examples 13-14), wherein the analog reference signal includes multiple tones of sinusoids.

Another example (e.g., example 16) relates to a previously described example (e.g., any one of examples 12-15), wherein the processing system is a main ADC in a receiver.

Another example (e.g., example 17) relates to a previously described example (e.g., example 16), further comprising attenuating the analog reference signal, converting, by an observation ADC, the attenuated analog reference signal to digital domain, generating the reconstructed reference signal by removing a distortion incurred by the observation ADC from an output of the observation ADC, generating coefficients for the main ADC based on the reconstructed reference signal, and generating the coefficients for the non-linear equalizer based on the coefficients for the main ADC and the reconstructed reference signal.

Another example (e.g., example 18) relates to a previously described example (e.g., any one of examples 12-17), wherein the analog reference signal is chosen to be uncorrelated with the input signal.

Another example (e.g., example 19) relates to a previously described example (e.g., example 18), wherein spectra of the analog reference signal and the input signal do not overlap.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F) PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

The invention claimed is:

1. A system for equalization of a linear or non-linear system, comprising:
   an adder configured to add an analog reference signal and an input signal;
   a processing system configured to process a sum of the analog reference signal and the input signal;
   a non-linear equalizer (NLEQ) configured to process an output of the processing system to remove a distortion incurred by the processing system;
   a calibration circuitry configured to generate a reconstructed reference signal in digital domain based on measurement of the analog reference signal, and generate coefficients for the NLEQ based on the reconstructed reference signal and the output of the processing system; and
   a subtractor configured to subtract the reconstructed reference signal from an output of the NLEQ.

2. The system of claim 1, wherein the analog reference signal is a sinusoid.

3. The system of claim 2, wherein the analog reference signal includes harmonics of a fundamental frequency component.

4. The system of claim 2, wherein the analog reference signal includes multiple tones of sinusoids.

5. The system of claim 1, wherein the processing system includes a main analog-to-digital converter (ADC) in a receiver.

6. The system of claim 5, wherein the main ADC is a time-interleaved ADC.

7. The system of claim 5, wherein the calibration circuitry includes:
   an attenuator configured to attenuate the analog reference signal;
   an observation ADC configured to convert the attenuated analog reference signal to digital domain;
   a reference reconstruction circuitry configured to remove a distortion incurred by the observation ADC from an output of the observation ADC to generate the reconstructed reference signal;
   an ADC model estimation circuitry configured to generate coefficients for the main ADC based on the reconstructed reference signal; and
   an NLEQ coefficient estimation circuitry configured to generate the coefficients for the NLEQ based on the coefficients for the main ADC and the reconstructed reference signal.

8. The system of claim 7, wherein the observation ADC is running at a lower sampling rate than the main ADC.

9. The system of claim 1, wherein the analog reference signal is chosen to be uncorrelated with the input signal.

10. The system of claim 9, wherein spectra of the analog reference signal and the input signal do not overlap.

11. The system of claim 1, wherein the calibration circuitry is turned off once the NLEQ is adapted.

12. A method for equalization of a linear or non-linear system, comprising:
   adding an analog reference signal and an input signal;
   processing, by a processing system, a sum of the analog reference signal and the input signal;
   processing, by a non-linear equalizer, an output of the processing system to remove a distortion incurred by the processing system;
   generating a reconstructed reference signal in digital domain based on measurements of the analog reference signal;
   generating coefficients for the non-linear equalizer based on the reconstructed reference signal and the output of the processing system; and
   subtracting the reconstructed reference signal from an output of the non-linear equalizer.

13. The method of claim 12, wherein the analog reference signal is a sinusoid.

14. The method of claim 13, wherein the analog reference signal includes harmonics of a fundamental frequency component.

15. The method of claim 13, wherein the analog reference signal includes multiple tones of sinusoids.

16. The method of claim 12, wherein the processing system is a main analog-to-digital converter (ADC) in a receiver.

17. The method of claim 16, further comprising:
   attenuating the analog reference signal;
   converting, by an observation analog-to-digital converter (ADC), the attenuated analog reference signal to digital domain;
   generating the reconstructed reference signal by removing a distortion incurred by the observation ADC from an output of the observation ADC;
   generating coefficients for the main ADC based on the reconstructed reference signal; and
   generating the coefficients for the non-linear equalizer based on the coefficients for the main ADC and the reconstructed reference signal.

18. The method of claim 12, wherein the analog reference signal is chosen to be uncorrelated with the input signal.

19. The method of claim 18, wherein spectra of the analog reference signal and the input signal do not overlap.

* * * * *